United States Patent [19]

Van Buskirk et al.

[11] Patent Number: 5,291,446
[45] Date of Patent: Mar. 1, 1994

[54] VPP POWER SUPPLY HAVING A REGULATOR CIRCUIT FOR CONTROLLING A REGULATED POSITIVE POTENTIAL

[75] Inventors: Michael A. Van Buskirk, San Jose; Johnny C. Chen, Cupertino; Chung K. Chang, Sunnyvale; Lee E. Cleveland, Santa Clara, all of Calif.; Antonio Montalvo, Raleigh, N.C.

[73] Assignee: Advanced Micro Devices, Inc., Sunnyvale, Calif.

[21] Appl. No.: 964,684

[22] Filed: Oct. 22, 1992

[51] Int. Cl.⁵ .................................................. H03L 1/00
[52] U.S. Cl. ........................... 365/189.09; 365/149; 365/189.06; 307/296.1
[58] Field of Search .............. 365/189.09, 189.11, 365/185, 218, 149, 189.06, 900; 307/296.1, 296.2, 296.6

[56] References Cited

U.S. PATENT DOCUMENTS

| | | | |
|---|---|---|---|
| 4,691,216 | 9/1987 | Terada et al. | 365/185 |
| 4,710,647 | 12/1987 | Young | 307/296.2 |
| 4,935,644 | 6/1990 | Tsujimoto | 307/296.1 |
| 5,029,282 | 7/1991 | Ito | 307/296.2 |

Primary Examiner—Eugene R. LaRoche
Assistant Examiner—Vu A. Le
Attorney, Agent, or Firm—Davis Chin

[57] ABSTRACT

A positive power supply for generating and supplying a regulated positive potential to control gates of selected memory cells via word lines in an array of flash EEPROM memory cells during programming includes a clock circuit (18b) for generating a pair of non-overlapping clock signals and charge pump means (18c) responsive to an external power supply potential (VCC) and to the non-overlapping clock signals for generating a high positive voltage. A regulator circuit (20) responsive to the high positive voltage and a reference voltage is provided for controlling the regulated positive potential so that it is independent of the external power supply potential (VCC).

8 Claims, 7 Drawing Sheets

VPP POWER SUPPLY HAVING A REGULATOR CIRCUIT FOR CONTROLLING A REGULATED POSITIVE POTENTIAL

BACKGROUND OF THE INVENTION

1. Field of the invention

This invention relates generally to floating gate memory devices such as an array of flash electrically erasable programmable read-only memory (EEPROM) cells. More particularly, the present invention relates to an improved positive power supply for generating and supplying a regulated positive potential to control gates of selected memory cells via wordlines in an array of flash EEPROM memory cells during programming.

2. Description of the Prior Art

In U.S. Pat. No. 5,077,691 to Sameer S. Haddad et al. issued on Dec. 31, 1991, there is disclosed a flash EEPROM array which includes a positive voltage charge pump 206. The '691 patent is assigned to the same assignee as in the present invention and is hereby incorporated by reference. During a sector-programming mode of operation, the charge pump 206 in FIG. 2B of the '691 patent generates a relatively high positive potential (i.e., +12 volts) which is applied to the control gates via the wordlines of the selected sectors while zero volts are applied to the control gates of memory cells in the non-selected sectors. Further, the source regions of all transistors in the selected sectors are pulled to a ground potential of zero volts, and the drain regions thereof are raised to a high positive level of approximately +6.5 volts.

In FIG. 5B of the '691 patent, there is shown a schematic circuit diagram of the positive charge pump circuit formed of four single-stages 502 for generating the high positive potential of approximately +12 volts to +15 volts. The positive charge pump circuit of FIG. 5B is used for the charge pump block 206 shown in FIG. 2B of the '691 patent. Further, in FIG. 4C there is depicted a low negative charge pump circuit formed of a single stage 402 for generating a relatively low level negative voltage of approximately −2.0 volts. The negative pump circuit of FIG. 4C is used for the charge pump block 208 shown in FIG. 2B.

In U.S. Pat. No. 5,126,808 to Antonio J. Montalvo et al issued on Jun. 30, 1992, there is disclosed a flash EEPROM array with page erased architecture which also includes a positive voltage charge pump. The '808 patent is also assigned to the same assignee as in the present invention and is hereby incorporated by reference. In FIG. 7E of the '808 patent, there is shown a schematic circuit diagram of the positive voltage charge pump, similar to FIG. 5B of the '691 patent, for generating the high positive potential of approximately +12 V. Further, in FIG. 7B there is illustrated a −13 volt charge pump 565 consisting of five interconnected single stage charge pumps 560. The output of the first stage 560-1 of the charge pump 565 is about −2.0 volts.

The present invention represents a significant improvement over the charge pump circuits shown in their respective '691 and '808 patents discussed above. The positive power supply of the present invention is used for generating and supplying a regulated positive potential to control gates of selected memory cells via wordlines in an array of flash EEPROM memory cells during programming. The positive power supply includes a positive charge pump circuit formed of four charge pump stages for generating a high positive voltage. The positive power supply further includes a regulation circuit which is responsive to the high positive voltage and a reference potential for generating the regulated positive potential to be independent of a power supply potential VCC.

SUMMARY OF THE INVENTION

Accordingly, it is a general object of the present invention to provide an improved positive power supply for generating and supplying a regulated positive potential to control gates of selected memory cells via wordlines in an array of flash EEPROM memory cells during programming, but yet overcomes the disadvantages of the prior art power supplies.

It is an object of the present invention to provide an improved positive power supply for generating and supplying a regulated positive potential which includes a positive charge pump circuit for generating a high positive voltage and a positive regulator circuit for controlling the regulated positive potential to be independent of an external power supply potential VCC.

It is still another object of the present invention to provide an improved positive power supply for generating and supplying a regulated positive potential which includes a negative protect pump circuit for generating a small negative protection voltage on its output so as to cause the wordlines coupled to control gates of non-selected memory cells to be pulled down to the ground potential.

In accordance with these aims and objectives, the present invention is concerned with the provision of a positive power supply for generating and supplying a regulated positive voltage to control gates of selected memory cells via wordlines in an array of flash EEPROM memory cells during programming. The positive power supply includes a clock circuit for generating a pair of non-overlapping clock signals and a charge pump circuit responsive to an external power supply potential VCC and to the non-overlapping clock signals for generating a high positive voltage. A regulator circuit is responsive to the high positive voltage and a reference voltage for generating a positive comparator signal which is either at a low level so as to allow the charge pump circuit to increase the high positive potential or is at a high level so as to decrease the high positive voltage and for generating the regulated positive potential to be independent of the power supply potential VCC.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
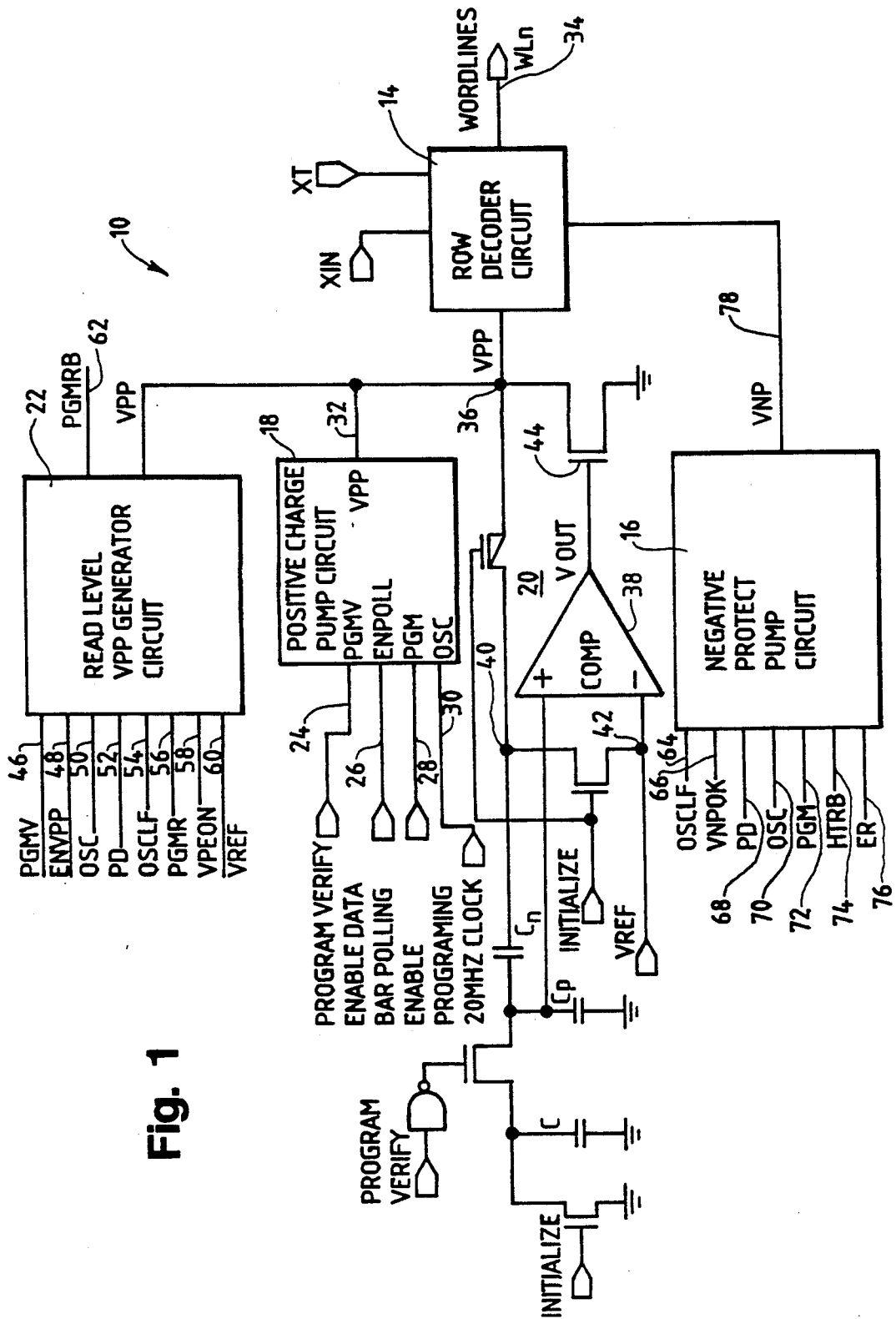
FIG. 1 is a simplified block diagram of a positive power supply for use with a row decoder circuit, constructed in accordance with the principles of the present invention.

Referring now in detail to the drawings, there is shown in block diagram form in FIG. 1 a positive power supply 10 for generating and supplying a regulated positive potential to control gates of selected memory cell transistors to the wordlines during the programming mode of operation, which is constructed in accordance with the principles of the present invention. The positive power supply 10 is formed as part of a single integrated circuit chip (not shown) which contains an array having a large number of flash EEPROM memory cells arranged in an N×M matrix. An external or off-chip power supply potential VCC (also not shown), which is typically at +5.0 V, is supplied to the integrated circuit chip and is fed to the input of the positive power supply 10.

The array of the flash EEPROM memory cells is formed on a substrate to define columns and rows, where the substrate includes a common source line extending along at least one of the rows and a plurality of bit lines extending along respective columns. Each of the memory cells includes an N-type source region coupled to the common source line, a control gate, a floating gate, a channel region and an N-type drain region coupled to a respective one of the bit lines. Further, each of the memory cells is programmable predominately by transferring hot electrons into its floating gate and is erasable predominately by tunneling electrons from its floating gate to its source region.

The positive power supply 10 generates a relatively high positive voltage VPP and a relatively low negative voltage VNP which are coupled to the wordlines WLn via a row decoder circuit 14. The row decoder circuit operates to supply the high positive voltage to the control gates of the selected memory cell transistors through the wordlines during programming. The row decoder circuit also causes the wordlines coupled to the control gates of the non-selected memory cell transistors to be pulled down to a ground potential VSS (zero volts). The positive or VPP power supply includes a negative protect pump circuit 16 which is used to generate a negative protection voltage VNP so as to prevent the forward biasing of the substrate diode of the N-channel pull-down device in the row decoder circuit 14 during erase. This protection voltage also allows the deselected wordlines to be pulled to ground during the programming as well as providing the proper voltage to protect the oxide of the VNP P-channel transistor itself (during programming).

The VPP power supply also includes a high level positive charge pump circuit 18 for generating the high positive voltage and a positive regulator circuit 20 for adjusting the high positive voltage with respect to the internal reference voltage VREF (+2.0 volts). The positive regulator circuit includes means for regulating the high positive voltage VPP to +6.0 volts during the program verify mode of operation. Further, the VPP power supply includes a read level VPP generator circuit 22 for pulling the high positive voltage VPP to the power supply potential VCC during a read mode of operation.

The operation of the VPP power supply 10 of FIG. 1 will be generally described with reference to the timing diagrams of FIG. 2(a). Specific circuitry suitable for use in the blocks 14, 16, 18, 20 and 22 of FIG. 1 so as to implement the functions described will be presented with reference to the schematic circuit diagrams of FIGS. 3 through 7.

With reference again to FIG. 1, the positive pump circuit 18 receives four input signals consisting of a program verify signal PGMV, an enable data bar polling signal ENPOLL, an enable programming signal PGM, and a 20 MHz clock signal OSC on respective lines 24, 26, 28 and 30. The positive pump circuit 18 is used to generate the high positive voltage VPP on line 32 which is approximately +12 volts. This positive voltage is passed to the wordlines WLn on line 34 via the row decoder circuit 14.

The programming field (the voltage on the floating gate) is regulated by the positive regulator circuit 20, which controls the node 36 so that it is independent of the external power supply potential VCC. Prior to entering the programming mode, the signal INITIALIZE is made high so as to allow the reference voltage VREF of approximately +2.0 volts to charge the capacitors Cn and Cp. During the programming mode, the signal INITIALIZE is made low so as to isolate the reference voltage VREF. A positive comparator 38 is used to compare the voltage VPPDIV at node 40 with the reference voltage VREF at node 42. When the voltage VPPDIV is larger than the voltage VREF, the output voltage VOUT of the comparator 38 is high which turns on the pull-down transistor 44 so as to pull down the high positive voltage at the node 36 towards the power supply potential VCC. On the other hand, when the voltage VPPDIV is smaller than the reference voltage VREF, the output voltage VOUT will be low which turns off the pull-down transistor 44, thereby allowing the high positive voltage to be pumped up.

The read level VPP generator circuit 22 receives as its inputs the program verify signal PGMV on line 46, the VPP pump enable signal ENVPP on line 48, the 20 MHz clock signal OSC on line 50, and a power-down signal PD on line 52. Further, the read level VPP generator circuit 22 receives as its inputs a low frequency clock signal OSCLF on line 54, a program reset signal PGMR on line 56, a pump enable signal VPEON on line 58, and the reference voltage VREF on line 60. The read generator circuit 22 is used to pull up the high positive voltage VPP at the node 36 to the positive potential VCC (+5.0 volts) during the read mode of operation. The read generator circuit also provides a program reset bar signal PGMR on output line 62.

The negative protect pump circuit 16 receives as its inputs the low frequency clock signal OSCLF on line 64, a negative protection enable signal VNPOK on line 66, the power-down signal PD on line 68, the 20 MHz clock signal OSC on line 70, and a program signal PGM on line 72. The negative protect pump circuit further includes as its inputs a test signal HTRB on line 74, and an erase control signal ER on the line 76. The negative protect pump circuit generates the negative protection signal VNP on line 78 which is maintained at approximately −2.0 volts so that the wordlines coupled to control gates of the non-selected memory cells are pulled down to zero volts during programming. During erase, the wordlines coupled to the control gates of the selected memory cells are required to be applied with −12 volts. Thus, the negative protection signal VNP will be pulled to the ground potential so as to prevent the substrate diode on the N-channel pull-down transistor from forward biasing and discharging the negative wordline voltage.

Figure 2A:
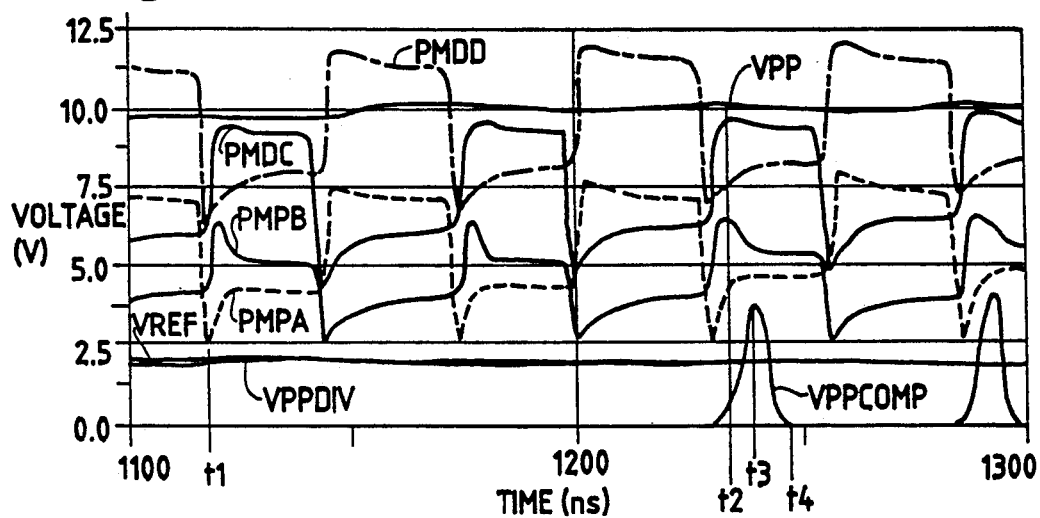
FIG. 2(a) is a timing diagram indicating the state of various signals, useful in understanding the operation of the present invention.

Referring now to FIG. 2(a), there are shown the output waveforms of each stage of the positive pump circuit 18 and are labeled PMPA, PMPB, PMPC and PMPD. With the positive pump circuit working between the times t1 and t2, the positive voltage VPP will be pumped to slightly higher than +10 volts. At the time t2, the positive regulator circuit 20 will begin its operation so as to control the voltage on the wordline WLn to be maintained at approximately +10 volts. If the positive voltage VPP goes above +10.1 volts, the positive comparator signal VOUT (VPPCOMP) will go high, such as at time t3, so as to pull down or decrease the positive voltage VPP as well as the voltage on the wordline. Then, the positive comparator signal will go low, such as at the time t4, so as to allow the positive voltage VPP to increase or go high again. This cycle is repeated over and over again so as to provide the regulated positive potential on the wordline WLn.

Figure 3:
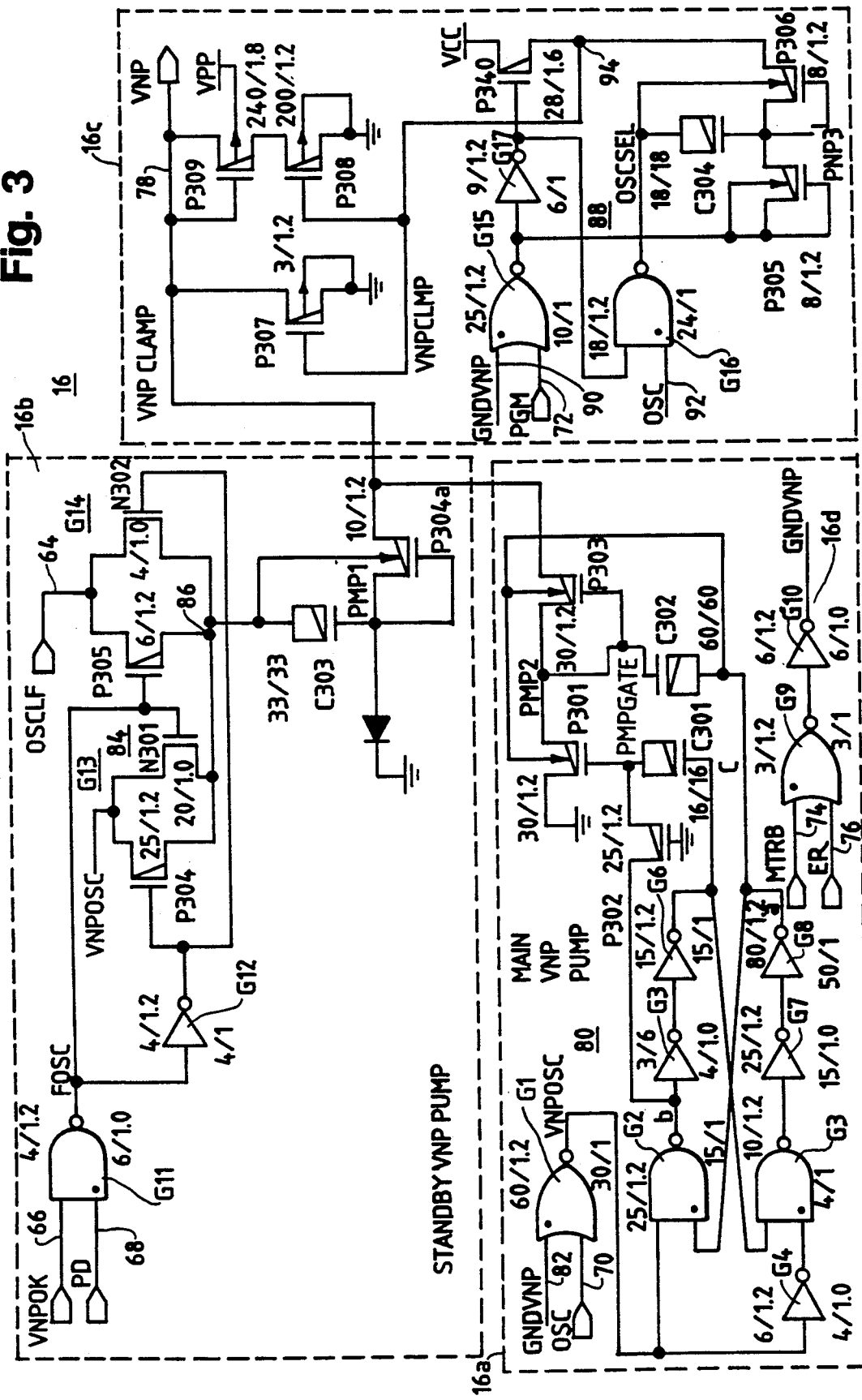
FIG. 3 is a detailed schematic circuit diagram of the negative protect pump circuit of FIG. 1.

A detailed circuit diagram of the negative protect pump circuit 16 of FIG. 1 is depicted in FIG. 3. The negative protect pump circuit 16 is formed of a main VNP pump section 16a, a standby VNP pump section 16b, and a VNP clamp section 16c. The main VNP pump section 16a includes a pump clock generator 80 formed by a NOR logic gate G1; NAND logic gates G2, G3; and inverter gates G4 through G8. The pump clock generator 80 receives the 20 MHz clock signal OSC on the line 70 and an enable signal GNDVNP on line 82 and produces in response a pair of biphase clock signals at nodes c and a, respectively. These clock signals are connected to one side of the respective capacitors C301 and C302. The other side of the capacitors are connected to the gates of a pair of pass transistors P301 and P303. An initialization transistor P302 serves to pre-charge the node pmpgate and to provide cancellation of the threshold drop $V_{tp}$ across the pass transistor P301. It should be noted that the N-wells of the transistors P301 and P303 are tied to the node a so as to define a switchable well. This serves to reduce the body effect on the pass transistors and increase the efficiency of the pump section 16a. The voltage VNP on the line 78 is quickly pumped by the pump section 16a to approximately −4 volts due to the loss of a threshold drop across the pass transistor P303.

The main VNP pump section 16a also includes an enable logic circuit 16d formed of a NOR logic gate G9 and an inverter gate G10. During a test mode of operation, a signal HTRB on the line 74 will be high and during the erase mode the erase control signal ER on the line 76 will be high. This causes the enable signal GNDVNP to be high, thereby disabling the negative protect pump circuit 16.

The standby VNP pump section 16b is a second pump which is connected in parallel with the main VNP pump section 16a. The pump section 16b includes a clock pump generator 84 formed of a NAND logic gate G11; an inverter G12; and transmission gates G13, G14. The transmission gate G13 is formed of a P-channel transistor P304 and an N-channel transistor N301. The transmission gate G14 is formed of a P-channel transistor P305 and an N-channel transistor N302. The pump section 16b receives the low frequency clock signal OSCLF (approximately 100 KHz) on the line 64, the negative protection enable signal VNPOK on the line 66, and the power-down signal PD on the line 68. The input of the transmission gate G13 receives the signal VNPOSC from the output of the NOR gate G1 of the pump section 16a. The outputs of the transmission gates G13 and G14 are connected together and to a node 86 which is in turn joined to one side of the capacitor C303. The other side of the capacitor C303 is connected to the gate of the diode-connected pass transistor P304a. Again, it can be seen that the N-well of the transistor P304a is tied to the node 86 so as to define a switchable well, thereby reducing its body effect.

The enable signal VNPOK on the line 66 will be low, when the negative protection signal VNP is not negative enough, which causes the signal VNPOSC (fast oscillator) to drive the node 86 so as to charge the voltage VNP quickly negative. When the voltage VNP is sufficiently negative, the signal VNPOK will go high. Then, during power-down the signal PD will also be high. As a result, the left side of the standby pump section 16b is disabled and the node 86 will be driven by the low frequency clock signal OSCLF, thereby maintaining the voltage VNP at approximately −2 volts and reducing the power consumption of the circuits.

The VNP clamp section 16c includes a pump clock driver 88 formed of a NOR logic gate G15, a NAND logic gate G16, and an inverter gate G17. The clock driver 88 receives the signal GNDVNP on line 90, the program signal PGM on the line 72, and the 20 MHz clock signal OSC on line 92. The signal OSCERSL at the output of the NAND gate G16 is fed to one side of capacitor C304. The other side of the capacitor C304 is connected to the gate of the diode-connected transistor P306. The gate and source of a pre-charge transistor P305 is connected to the output of the NOR gate G15. The output signal VNPCLMP at node 94 is fed to the gates of a non-programming mode clamping transistor P307 and a programming mode clamping transistor P308. The source of the clamping transistor P307 is connected to the ground potential (VSS) and its drain is connected to the line 78. A diode-connected transistor P309 is connected between the drain of the clamp transistor P308 and the line 78. During erase, the signal GNDVNP will be high and the node 94 will be pumped to approximately −2 volts. This turns on the clamp transistor P307, thereby pulling the line 78 (VNP) to the ground potential. During programming, the signal PGM will be high and the node 94 will still be pumped to approximately −2 volts. This enables the large clamp transistor P308 to clamp the VNP line to approximately −2 volts since the pump sections 16a and 16b are turned on.

Figure 4:
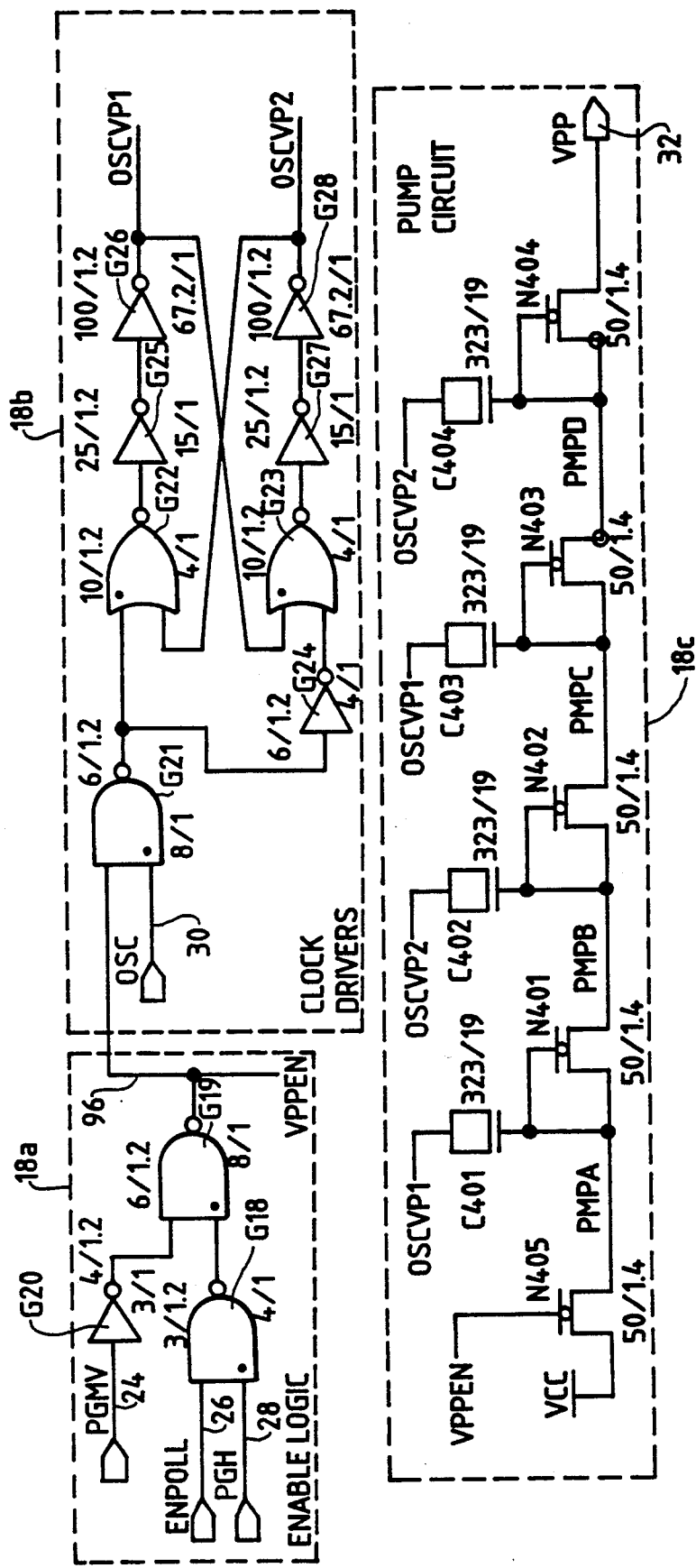
FIG. 4 is a detailed circuit diagram of the positive pump circuit of FIG. 1.

FIG. 4 is a circuit diagram depicting circuitry for the VPP pump circuit 18 of FIG. 1. The pump circuit 18 is formed of an enable logic circuit 18a, a pump clock driver circuit 18b, and a positive charge pump circuit 18c. The enable logic circuit 18a includes NAND logic gates G18, G19 and an inverter gate G20. The logic circuit 18a receives the signal PGMV on the line 24, the signal ENPOLL on the line 26, and the signal PGM on the line 28. The circuit 18a generates an enable signal VPPEN on the line 96 which is fed to the clock driver circuit 18b and the charge pump circuit 18c.

The pump clock driver circuit 18b includes a NAND logic gate G21; NOR logic gates G22, G23; and inverter gates G24 through G28. The driver circuit 18b receives the clock signal OSC on the line 30 and the internal pump enable signal VPPEN on the line 96 from the logic circuit 18a. The driver circuit 18b produces a pair of non-overlapping clock signals OSCVP1 and OSCVP2 at the respective outputs of the inverter gates G26 and G28.

The charge pump circuit 18c is a conventional four-stage charge pump formed of a chain of diode-connected pass transistors N401-N404 and capacitors C401-C404 connected in parallel between the pass transistors. The clock signal OSCVP1 is connected to one side of the capacitors C401 and C403, and the clock signal OSCP2 is connected to one side of the capacitors C402 and C404. The other side of the capacitors C401 and C403 are connected to respective nodes PMPA and PMPC. The other side of the capacitors C402 and C404 are connected to respective nodes PMPB and PMPD. A charging transistor N405 has its drain connected to the power supply potential VCC, its gate connected to receive the internal pump enable signal VPPEN, and its source connected to the node PMPA. The pump circuit 18c provides the high positive voltage VPP on the line 32.

The operation of the positive pump circuit 18 will now be described. The charge pump circuit 18c is started by the internal pump enable signal VPPEN going high so as to allow the positive potential VCC to charge up the node PMPA. It is assumed that the node PMPA will have been charged to a voltage $VCC-V_{tp}$ by the transistor N405. Thus, when the clock signal OSCP1 makes the transition from $\phi$ volts to VCC volts, the node PMPA is also raised in potential and would reach $2VCC-V_{tp}$ except for the fact that the pass transistor N401 will turn on, causing the charge on the node PMPA to be shared with the node PMPB. Similarly, when the clock signal OSCP2 makes the transition from $\phi$ volts to VCC volts, the node PMPB will be raised in potential and its charge will be shared with the node PMPC. In this manner, the line 32 (VPP) is gradually pumped to the high voltage throughout the duration of the pump enable signal VPPEN. The limiting potential which can be reached by using this conventional charge pump design is $4VCC-5V_{tp}$. Since the threshold voltage $V_{tp}$ may be as high as +1.5 volts, the high positive voltage VPP is limited to approximately +12.5 volts for the power supply potential VCC of +5.0 volts.

Figure 2B:
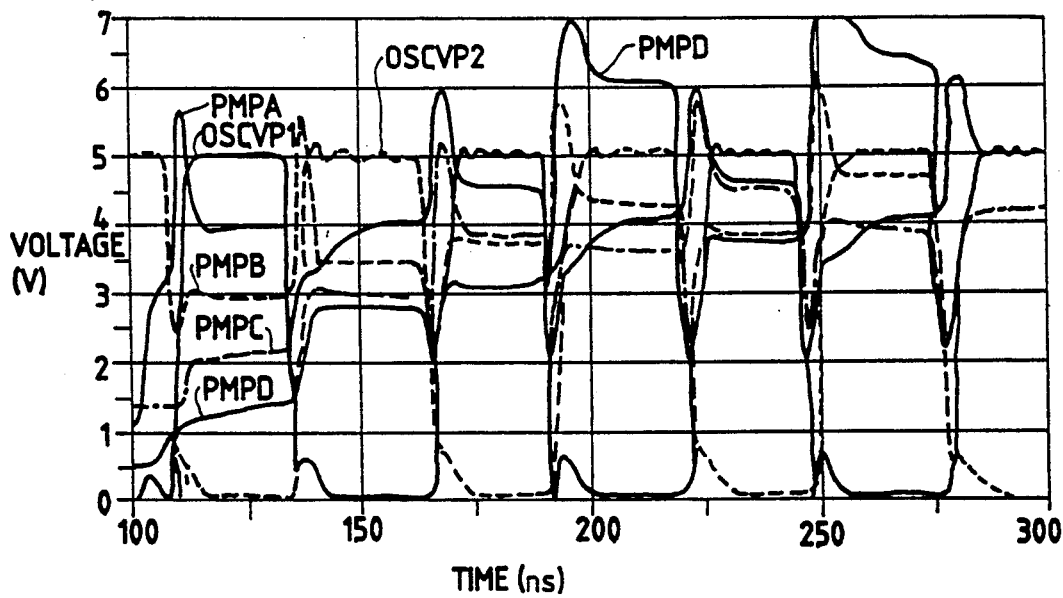
FIG. 2(b) is a timing diagram indicating the state of various signals at certain internal nodes in FIG. 4, useful in understanding the operation of the positive pump circuit.

For a more complete discussion of the conventional voltage multiplier, reference is made to the article by John F. Dickson, "On-Chip High-Voltage Generation in MNOS Integrated Circuits Using An Improved Voltage Multiplier Technique," IEEE Journal of Solid-State Circuits, Vol. SC-11, No. 3, June 1976, pp. 374-378. The initial cycles of the waveforms of the clock signals OSCP1 and OSCP2 and of the voltages at the various nodes PMPA through PMPD of the charge pump circuit 18c are depicted in FIG. 2(b), illustrating the operation of the pump circuit 18 for pumping up the high positive voltage VPP.

Figure 5:
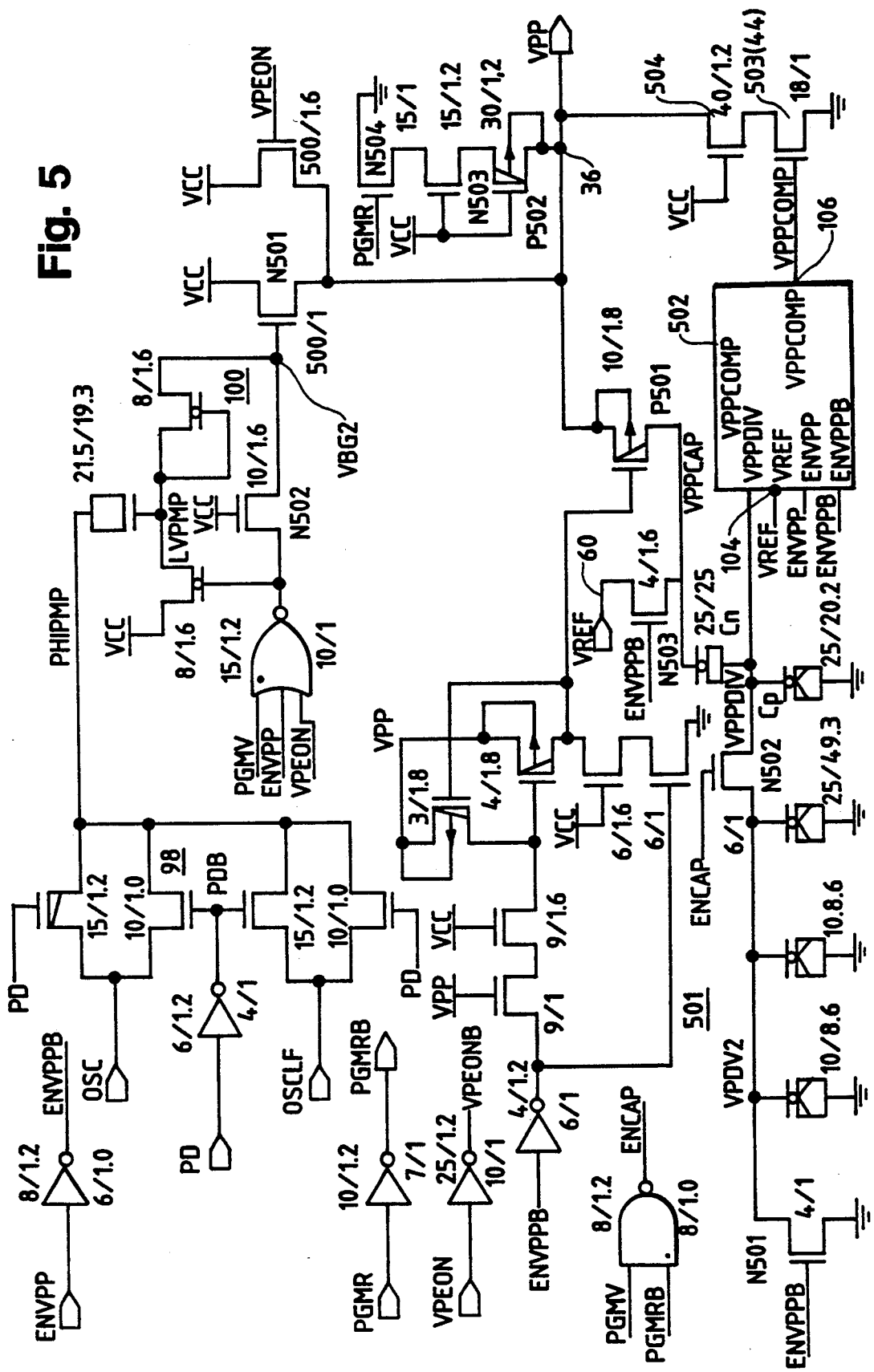
FIG. 5 is a detailed circuit diagram of the positive voltage regulator circuit of FIG. 1.

The programming level VPP generator and regulator circuit (positive regulator circuit) 20 and the read level VPP generator circuit 22 of FIG. 1 are illustrated in the schematic circuit diagram of FIG. 5. The read generator circuit 22 is used to pull up the high positive voltage VPP on the node 36 to the power supply potential VCC (+5.0 volts) during the read mode of operation. The read generator circuit includes a clock driver section 98 and a charge pump section 100 driven by the driver section 98. During the read mode, a node VBG2 will be pumped up to approximately +8 volts by the high frequency clock signal OSC. When in the powered-down condition, the signal PD will be high so that the pump section 100 will be driven by the low frequency clock signal OSCLF so as to maintain the voltage at the node VBG2. As a result, the pull-up transistor N501 will be turned on so as to pull the node 36 (VPP) to the power supply voltage potential VCC. When the external high voltage pump enable signal (VPEON=1) or the enable signal ENVPP is high (i.e., during non-programming), the node VBG2 will be pulled to the ground potential via the transistor N502.

The positive regulator circuit 20 is used to regulate the programming field by controlling the node 36 (VPP) so that it is independent of the external power supply potential VCC. The regulator circuit consists of a reference voltage VREF, a pre-charge circuit 501, a differential comparator 502, a pull-down transistor 503, and an isolation transistor 504. The reference voltage is applied on the line 60 and is at approximately +2.0 volts. The pre-charge circuit 501 includes pre-charge transistors N501, N502, N503; an N-well type capacitor Cp; a MOS capacitor Cn; a sensing transistor P501; and discharge transistors P502, N503, N504. Before the programming mode, the signal ENVPPB will be made high initially so as to pre-charge the node VPPDIV to the ground potential VSS ($\phi$ volts) and to pre-charge the node VPPCAP to the reference voltage of +2.0 volts. Then, the signal ENVPP will be made low so as to isolate the reference voltage. As can be seen, the capacitor Cn is connected between the nodes VPPCAP and VPPDIV and will be turned on. The capacitor Cp is connected between the nodes VPPDIV and the ground potential. Thus, the voltage at the node VPPCAP will be divided down by the capacitive divider formed by the capacitors Cn and Cp so as to provide a smaller voltage at node 102. During program reset, the transistors P502, P503 and N504 are used to discharge the line 36.

In operation, the differential comparator 502 compares the voltage at the node 102 (VPPDIV) to the reference voltage on the node 104 and generates a positive comparator output signal VPPCOMP on line 106. The sizes of the capacitors are ratioed so that the trip point of the comparator is at approximately +10 volts. If the high positive voltage VPP rises above +10 volts, the sensing transistor will be turned on so as to raise the voltage at the node VPPCAP and thus the voltage at the node 102. Since the voltage at the node VPPDIV will be greater than the reference voltage at the node 104, the output signal VPPCOMP will be high so as to turn on the transistor 503, thereby pulling down the voltage VPP towards the positive supply potential VCC. On the other hand, if the high positive voltage VPP drops below +10 volts, the sensing transistor will be turned off so as to lower the voltage at the node VPPCAP and at the node 102. Since the voltage VPPDIV will now be less than the reference voltage at the node 104, the output signal VPPCOMP will be low so as to turn off the transistor 503. As a consequence, the voltage VPP on the line 38 is allowed to be pumped higher.

Figure 6:
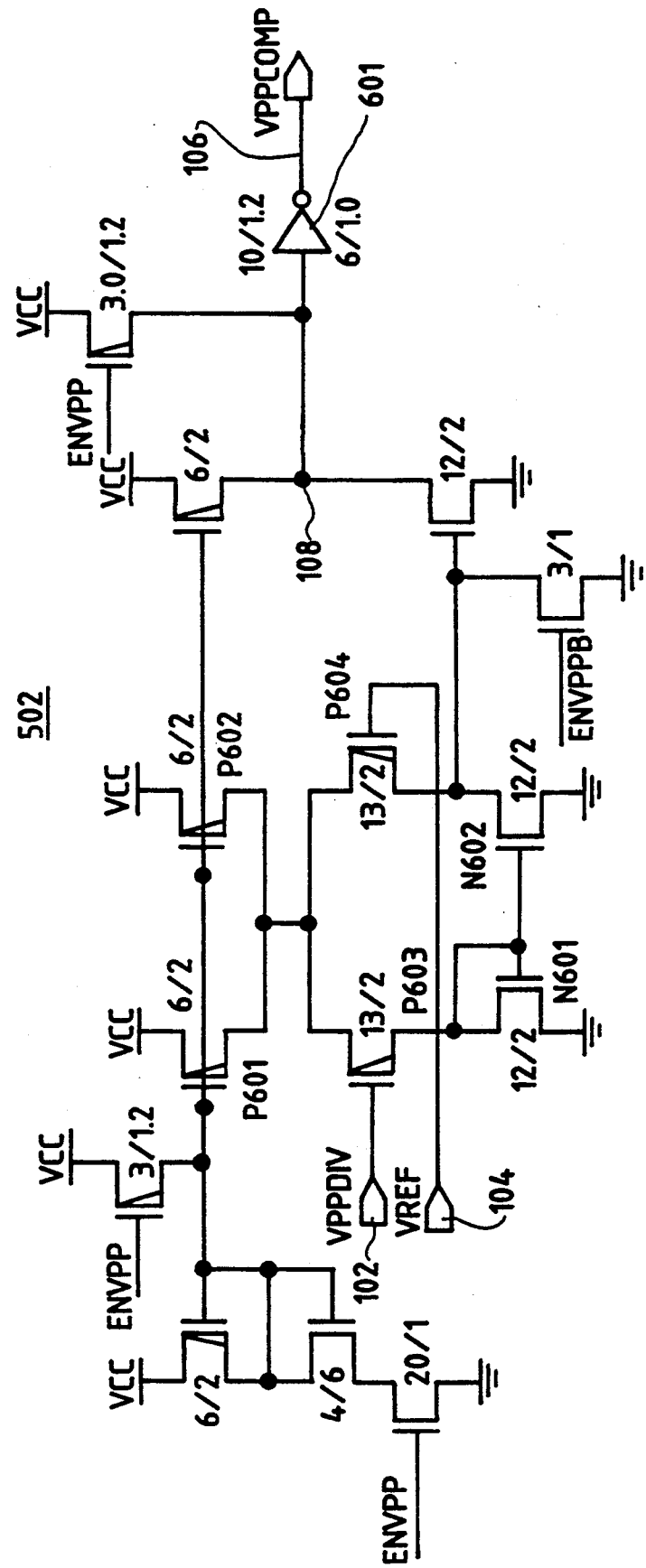
FIG. 6 is a detailed schematic circuit diagram of the positive comparator circuit of FIG. 5.

In FIG. 6, there is shown a detailed circuit diagram of the differential comparator 502 of FIG. 5. The differential comparator includes current source transistors P601, P602; input transistors P603, P604; and load transistors N601, N602. The gate of the input transistor P603 is connected to the node 102, and the gate of the input transistor P604 is connected to the node 104. The output node 108 of the comparator 502 is coupled via inverter gate 601 to the line 106. The output of the inverter 601 is the positive comparator output signal VPPCOMP.

Figure 7:
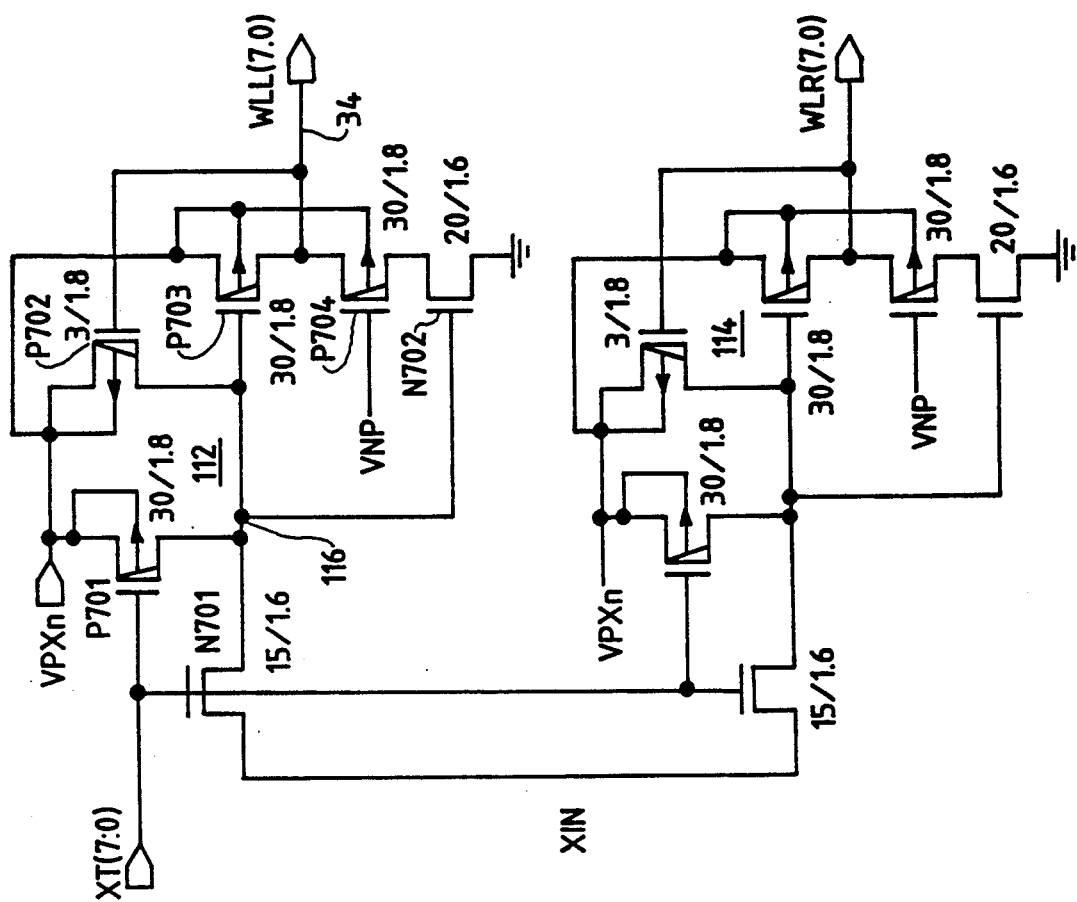
FIG. 7 is a circuit diagram of the row decoder circuit of FIG. 1.
Figure 7:
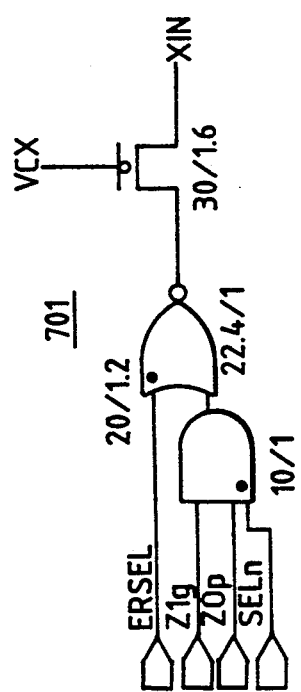

Referring now to FIG. 7, there is illustrated a circuit diagram of the row decoder circuit 14. The row decoder circuit 14 provides the appropriate voltage to the wordlines WLn based upon the high positive voltage VPP, the negative protection voltage VNP, and decoded address signals $X_T$, $X_{IN}$. The decoded address signal $X_{IN}$ is generated by the addressing circuitry 701, and the decoded address signal $X_T$ is generated by similar addressing circuitry (not shown). It should be understood that where the memory array is physically arranged in the matrix of 1024 rows by 1024 columns, each row in the memory array is driven by its own row decoder circuit. Thus, the row decoder circuit 14 represents only one of the 1024 row decoder circuits. The row decoder circuit 14 is formed of a left side decoder 112 and a right side decoder 114. Since both the left and right side decoders are identical, it will be sufficient to describe only the left side decoder 112.

The left side decoder 112 includes a pass transistor N701, an input transistor P701, a pull-up transistor P702, a pull-up transistor P703, a negative protect transistor P704, and a pull-down transistor N502. During the programming mode, the decoded signal $X_T$ will be high and the decoded signal $X_{IN}$ will be low for the selected rows. Further, in the selected rows the signal VPX will be equal to the high positive voltage VPP (+10 V) and the signal VNP will be at −2 volts. Thus, the node 116 will be low so as to turn off the pull-down transistor N702 and turn on the pull-up transistor P703, thereby applying the high voltage VPP to the wordline WLn (line 34). The negative protect transistor P704 serves to protect the substrate diode of the N-channel pull-down transistor N702 when the wordline has a high negative voltage applied thereto during erase.

However, the decoded signal $X_T$ will be low and the decoded signal $X_{IN}$ will be high for the non-selected rows during the programming mode. As a result, the node 116 will be high since the input transistor P701 will be turned on. This causes the pull-up transistor P703 to be turned off and turns on the pull-down transistor N702. The voltage VNP being at −2 volts will cause the negative protect transistor P704 to also turn on, thereby pulling the wordline WLn (line 34) all the way to the ground potential VSS.

From the foregoing detailed description, it can thus be seen that the present invention provides an improved positive power supply for generating and supplying a regulated positive potential to control gates of selected memory cells via wordlines in an array of flash EEPROM memory cells during programming. The positive power supply includes charge pumping means for generating a high positive voltage and regulator means responsive to the high positive voltage and a reference voltage for generating the regulated positive potential to be independent of the power supply potential VCC.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A positive power supply for generating and supplying a regulated positive potential to control gates of selected memory cells via word lines in an array of flash EEPROM memory cells during programming, said positive power supply comprising:
    charge pump means (18c) responsive to an external power supply voltage (VCC) and to non-overlapping clock signals for generating a high positive voltage;
    regulation means (20) responsive to said high positive voltage and a reference potential for generating a positive comparator signal which is either at a low level so as to allow said charge pump means to increase said high positive voltage or is at a high level so as to decrease said high positive voltage and for controlling said regulated positive potential to be independent of the power supply potential (VCC);
    negative protect circuit means for generating a small negative protection voltage on its output terminal so as to cause the word lines coupled to control gates of non-selected memory cells to be pulled down to the ground potential; and
    row decoder means coupled to the word lines and being responsive to said regulated positive potential, said small negative protection voltage, and decoded signals for selectively applying said regulated positive potential to the control gates of the selected memory cells and for selectively applying said ground potential to the control gates of the non-selected memory cells.

2. A positive power supply as claimed in claim 1, wherein said regulated positive potential is approximately +10.5 volts.

3. A positive power supply as claimed in claim 1, wherein said regulation means is comprised of a differential comparator (502) having a non-inverting input, an inverting input and an output, and an N-channel pull-down transistor (503), said differential comparator having its inverting input coupled to said high positive voltage, its non-inverting input coupled to the reference potential, and its output coupled to the gate of said N-channel pull-down transistor, the source of said N-channel pull-down transistor being coupled to a ground potential (VSS), the drain of said N-channel pull-down transistor being coupled to said charge pump means to provide said regulated positive potential.

4. A positive power supply as claimed in claim 1, further comprising read level generator (22) means coupled to said charge pump means for pulling down said high positive voltage to said power supply potential (VCC) during a read mode of operation.

5. A positive power supply as claimed in claim 1, wherein said regulation means includes means for regulating said high positive voltage to approximately +6.0 volts during a program verify mode of operation.

6. A positive power supply as claimed in claim 1, wherein said negative protect circuit means includes main charge pump means (16a) responsive to high frequency clock signal for pumping quickly its output voltage to said small negative protection voltage.

7. A positive power supply as claimed in claim 6, wherein said negative protect circuit means further includes standby charge pump means (16b) responsive selectively to said high frequency clock signal and a low frequency clock signal for facilitating pumping of said output of said small negative protection voltage and for maintaining said output voltage at said small negative protection voltage during power-down.

8. A positive power supply as claimed in claim 7, wherein said negative protect circuit means further includes negative clamping means (16c) coupled to said output terminal for clamping said small negative protection voltage to a predetermined level.

* * * * *